US010379397B1

(12) United States Patent
Tang

(10) Patent No.: US 10,379,397 B1
(45) Date of Patent: Aug. 13, 2019

(54) METHOD AND STRUCTURE FOR IMPROVING DISPLAY QUALITY OF IRREGULAR SHAPED PANEL

(71) Applicant: Wuhan China Star Optoelectronics Technology Co., Ltd., Wuhan (CN)

(72) Inventor: Yuejun Tang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/300,048

(22) PCT Filed: Sep. 22, 2018

(86) PCT No.: PCT/CN2018/107147
§ 371 (c)(1),
(2) Date: Nov. 8, 2018

(30) Foreign Application Priority Data

May 31, 2018 (CN) .......................... 2018 1 0546896

(51) Int. Cl.
| | |
|---|---|
| *H01L 27/32* | (2006.01) |
| *G02F 1/1335* | (2006.01) |
| *G02F 1/1343* | (2006.01) |
| *H01L 51/52* | (2006.01) |
| *G02F 1/1368* | (2006.01) |
| *H01L 27/12* | (2006.01) |

(52) U.S. Cl.
CPC ...... *G02F 1/133512* (2013.01); *G02F 1/1368* (2013.01); *G02F 1/134309* (2013.01); *H01L 27/3246* (2013.01); *H01L 27/3262* (2013.01); *H01L 51/5209* (2013.01); *G02F 1/133514* (2013.01); *G02F 2001/134345* (2013.01); *G02F 2201/123* (2013.01); *H01L 27/1214* (2013.01); *H01L 27/3211* (2013.01)

(58) Field of Classification Search
CPC ................................ H01L 27/30; H01L 51/10
See application file for complete search history.

(56) References Cited

U.S. PATENT DOCUMENTS

2019/0140026 A1* 5/2019 Nakanishi ............. G02F 1/1335

FOREIGN PATENT DOCUMENTS

| | | |
|---|---|---|
| CN | 106340249 A | 1/2017 |
| CN | 107167957 A | 9/2017 |
| CN | 107479269 A | 12/2017 |
| CN | 107644610 A | 1/2018 |
| CN | 108010952 A | 5/2018 |

* cited by examiner

*Primary Examiner* — Cheung Lee
(74) *Attorney, Agent, or Firm* — Leong C. Lei

(57) ABSTRACT

The present invention teaches a design method and a structure for improving display quality of an irregular shaped panel. The design method includes: disposing an initial shading layer along an edge of the panel's actual display area; for a pixel not entirely covered by the initial shading layer but having at least a sub-pixel entirely covered by the initial shading layer, setting the pixel to be turned off at all times, or extending the initial shading layer to cover the pixel; and, for a pixel and each of its sub-pixels not entirely covered by the initial shading layer, setting the pixel so that a brightness ratio among its sub-pixels is, under a same driving condition, identical or close to that among the sub-pixels of a normal pixel. The design method and structure reduce or eliminate jagged feel and color shift along an edge of the area of notch or irregularity.

14 Claims, 5 Drawing Sheets

METHOD AND STRUCTURE FOR IMPROVING DISPLAY QUALITY OF IRREGULAR SHAPED PANEL

FIELD OF THE INVENTION

The present invention is generally related to the field of display technology, and more particularly to a design method and a structure for improving display quality of an irregular shaped panel

BACKGROUND OF THE INVENTION

As display products are gaining wide applicability, display manufacturers now focus on the design and development of irregular shaped panel such as IponeX's notch design. FIG. 1 shows an existing irregular shaped panel. The substrate or display area of an irregular shaped panel may have a circular, polygonal, or other irregular, non-rectangular shape. As pixels in the display area are often arranged in an array for easier design and driving, a shading layer is used between the display and non-display areas to achieve slant/curved edges.

Shading layer for existing irregular shaped panels mainly has two structures respectively shown in FIGS. 2A and 2B. FIG. 2A depicts a conventional linear shading layer 1 having a jagged edge to approximate a slant or curve edge between the display and non-display areas. A strong color or brightness contrast is presented along the jagged edge of the bright display area and dark non-display area. The jagged edge is therefore visible to the viewer, compromising the display panel's visual effect and user experience. FIG. 2B depicts another conventional shading layer which follows the edge of the actual display area. The jagged feel is reduced by this structure. However, the shading layer 2 is not aligned with the pixel arrangement and pixels along the edge may have their RGB sub-pixels covered by the shading layer 2 with different areas. The color mix along the edge is as such perceived differently from other locations of the display panel, thereby causing color shift or non-uniform brightness (mura) along the edge of the area of notch or irregularity of an irregular shaped panel.

SUMMARY OF THE INVENTION

An objective of the present invention is to teach a design method and a structure for reducing jagged feel and color shift along an edge of the area of notch or irregularity of an irregular shaped panel.

To achieve the objective, the present invention teaches a design method for improving the display quality of an irregular shaped panel, including the following steps:

Step 10: disposing an initial shading layer along an edge of the panel's actual display area;

Step 20: for a pixel not entirely covered by the initial shading layer but having at least a sub-pixel entirely covered by the initial shading layer, setting the pixel to be turned off at all times, or extending the initial shading layer to cover the pixel; and Step 30: for a pixel and each of its sub-pixels not entirely covered by the initial shading layer, adjusting a brightness ratio among the pixel's sub-pixels so that, the brightness ratio is identical or close to that among the sub-pixels of a normal pixel not covered by the initial shading layer under a same driving condition.

Step 30's adjusting the brightness ratio is achieved through adjusting an aperture ratio among the pixel's sub-pixels.

For a liquid crystal display (LCD) panel, adjusting aperture ratio among the pixel's sub-pixels is achieved through adding additional shading layer to the pixel's sub-pixels; and, for an organic light emitting diode (OLED) display panel, adjusting aperture ratio among the pixel's sub-pixels is achieved through adjusting pixel definition layer areas or adding additional pixel definition layer to the pixel's sub-pixels.

For a LCD panel, Step 30's adjusting the brightness ratio is achieved through adjusting pixel electrode shapes, dimensions, or areas of the pixel's sub-pixels; and, for an OLED display panel, Step 30's adjusting the brightness ratio is achieved through adjusting anode or cathode electrode areas of the pixel's sub-pixels.

For a LCD panel, Step 30's adjusting the brightness ratio is achieved through adjusting widths or lengths of ditch regions of thin film transistors (TFTs) charging pixel electrodes of the pixel's sub-pixels; and, for an OLED display panel, Step 30's adjusting the brightness ratio is achieved through adjusting widths or lengths of ditch regions of TFTs driving the pixel's sub-pixels.

For a LCD panel, Step 30's adjusting the brightness ratio is achieved through at least one of:

adjusting an aperture ratio among the pixel's sub-pixels;

adjusting pixel electrode shapes, dimensions, or areas of the pixel's sub-pixels; and adjusting widths or lengths of ditch regions of TFTs charging pixel electrodes of the pixel's sub-pixels.

For an OLED panel, Step 30's adjusting the brightness ratio is achieved through at least one of adjusting an aperture ratio among the pixel's sub-pixels;

adjusting anode or cathode electrode areas of the pixel's sub-pixels;

adjusting widths or lengths of ditch regions of TFTs driving the pixel's sub-pixels.

The present invention also teaches a structure for improving display quality of an irregular shaped panel, comprising an initial shading layer along an edge of the panel's actual display area, a plurality of normal pixels not covered by the initial shading layer, a plurality of pixels entirely covered by the initial shading layer, and a plurality of pixels partially covered by the initial shading layer, wherein the pixels partially covered by the initial shading layer comprises first pixels or second pixels; the first pixel has at least a sub-pixel entirely covered by the initial shading layer; the first pixels are set to be always turned off or are covered entirely by adding additional shading layer; the second pixels has all of their sub-pixels partially covered by the initial shading layer; the second pixels are adjusted to have a brightness ratio among their sub-pixels identical or close to that among the sub-pixels of a normal pixel under a same driving condition.

The second pixels are adjusted to have the brightness ratio through adjusting an aperture ratio among the second pixels' sub-pixels.

For a LCD panel, adjusting the aperture ratio is achieved through adding additional shading layers to the second pixels' sub-pixels; and, for an OLED display panel, adjusting the aperture ratio is achieved through adjusting pixel definition layer areas or adding additional pixel definition layers to the second pixels' sub-pixels.

For a LCD panel, the second pixels are adjusted to have the brightness ratio through adjusting pixel electrode shapes, dimensions, or areas of the second pixels' sub-pixels; and, for an OLED display panel, the second pixels are adjusted to have the brightness ratio through adjusting anode or cathode electrode areas of the second pixels' sub-pixels.

For a LCD panel, the second pixels are adjusted to have the brightness ratio through adjusting widths or lengths of ditch regions of TFTs charging pixel electrodes of the pixels' sub-pixels; and, for an OLED display panel, the second pixels are adjusted to have the brightness ratio through adjusting widths or lengths of ditch regions of TFTs driving the second pixels' sub-pixels.

For a LCD panel, the second pixels are adjusted to have the brightness ratio through at least one of adjusting an aperture ratio among the second pixels' sub-pixels;

adjusting pixel electrode shapes, dimensions, or areas of the second pixels' sub-pixels; and adjusting widths or lengths of ditch regions of TFTs charging pixel electrodes of the second pixels' sub-pixels.

For an OLED display panel, the second pixels are adjusted to have the brightness ratio through at least one of adjusting an aperture ratio among the second pixels' sub-pixels;

adjusting anode or cathode electrode areas of the second pixels' sub-pixels; and adjusting widths or lengths of ditch regions of TFTs driving the second pixels' sub-pixels.

As described above, the design method and the structure taught by the present invention is able to reduce or eliminate jagged feel along an edge of the area of notch or irregularity, and to eliminate color shift along an edge of the area of notch or irregularity, of an irregular shaped panel.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 7:
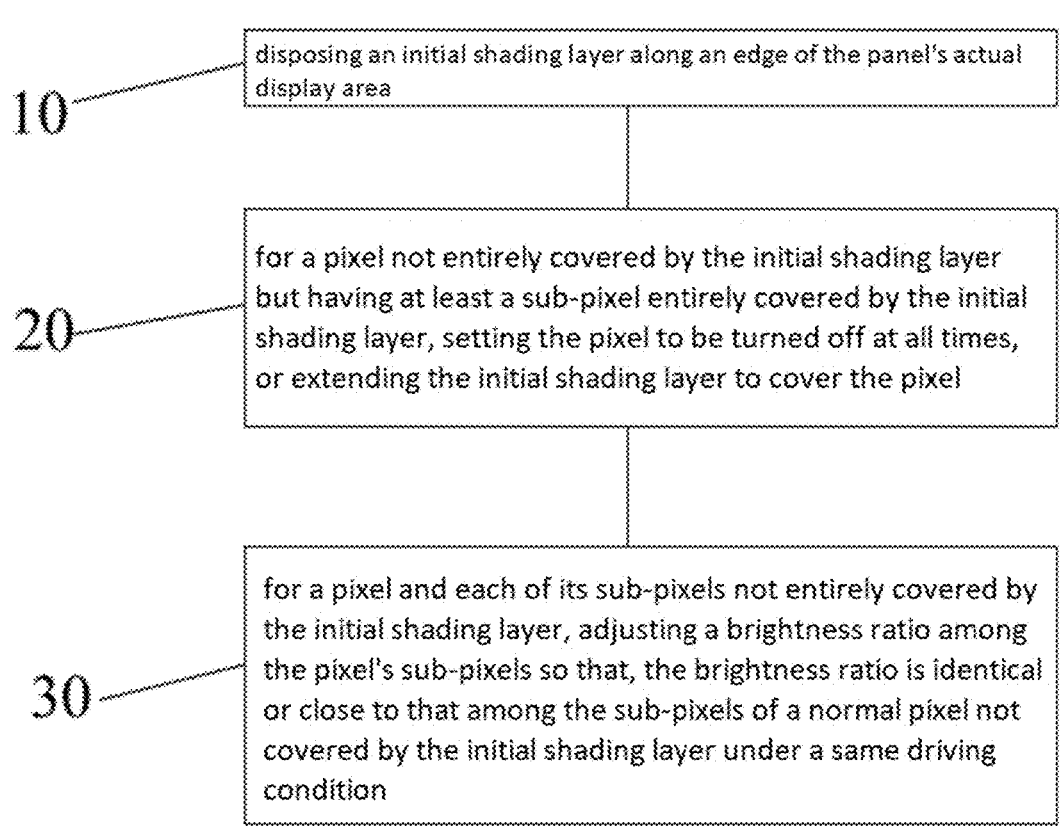
FIG. 7 is a flow diagram showing a design method for improving display quality of an irregular shaped panel according to an embodiment of the present invention.

The present invention teaches a design method of reducing jagged feel or color shift at an irregular shaped panel's area of notch or irregularity so as to improve display quality. As shown in FIG. 7, the design method includes the following steps:

Step 10: disposing an initial shading layer along an edge of the panel's actual display area;

Step 20: for a pixel not entirely covered by the initial shading layer but having at least a sub-pixel entirely covered by the initial shading layer, setting the pixel to be turned off at all times, or extending the initial shading layer to cover the pixel; and Step 30: for a pixel and each of its sub-pixels not entirely covered by the initial shading layer, setting the pixel so that a brightness ratio among its sub-pixels is, under a same driving condition, identical or close to that among the sub-pixels of a normal pixel not covered by the initial shading layer, thereby preventing color shift or non-uniform brightness at the and area of notch or irregularity.

In the following, an LCD panel is used as an example where each pixel includes R, G, and B sub-pixels. A pixel in a central location of the panel's active area, or a pixel in another location not covered by the initial shading layer is selected as the reference sub-pixel. The same driving condition means these pixels are under a same gamma voltage or of an identical gray level.

Figure 1:
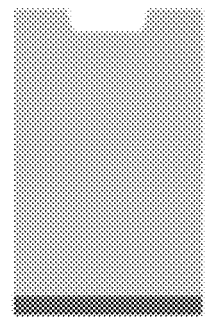
FIG. 1 shows an existing irregular shaped panel.
Figure 2A:
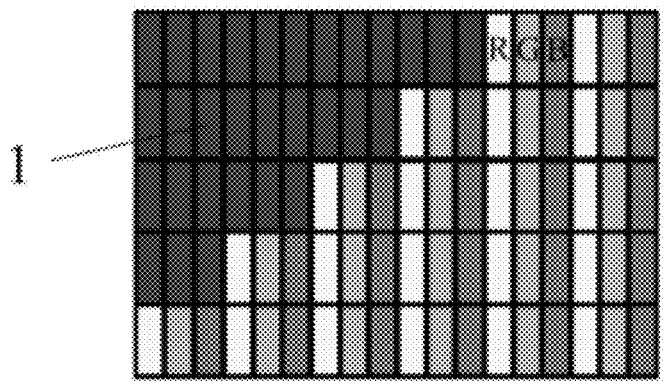
FIG. 2A is a schematic diagram showing a shading layer design for an existing irregular shaped panel.
Figure 2B:
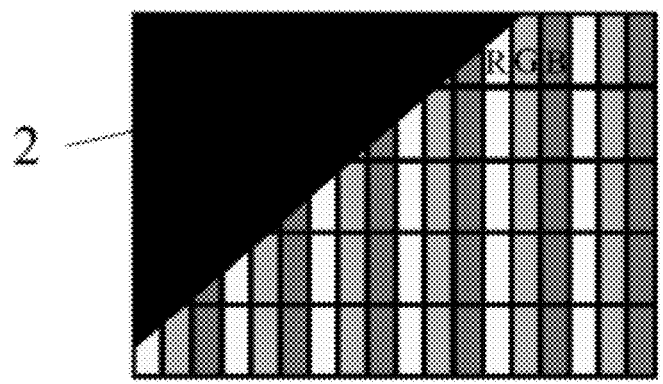
FIG. 2B is a schematic diagram showing another shading layer design for an existing irregular shaped panel.
Figure 3:
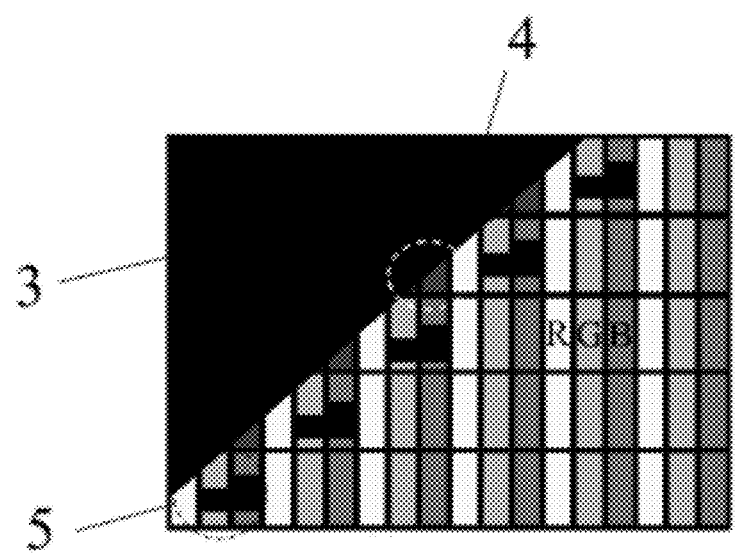
FIG. 3 is a schematic diagram showing a structure of an irregular shaped panel according to a first embodiment of the present invention.

FIG. 3 is a schematic diagram showing a structure of an irregular shaped panel according to a first embodiment of the present invention. Firstly, an initial shading layer 3 is disposed along an edge of the panel's actual display area bordering the area of notch or irregularity. A pixel 4 circled in FIG. 3 is not entirely covered by the initial shading layer 3 but having at least a sub-pixel (i.e., R sub-pixel) entirely covered by the initial shading layer 3. The pixel 4 then is turned off at all times, or the initial shading layer 3 is extended to entirely cover the G and B sub-pixel as well, so as to reduce the jagged feel along the edge.

For sub-pixels along the edge whose RGB sub-pixels are all partially covered by the initial shading layer 3, additional shading layer (i.e., black matrix, BM) is provided to one or two sub-pixels having greater apertures so that an aperture ratio among the RGB sub-pixels is identical to that among the RGB sub-pixels of a pixel in a central location (i.e., outside the area of notch or irregularity) so that the color shift or non-uniform brightness caused by inconsistent aperture ratio along the edge of the area of notch or irregularity may be eliminated. For example, if the aperture ratio among the RGB sub-pixels for pixels outside the area of notch or irregularity is 1:1.05:1.02, a pixel along the edge of the area of notch or irregularity partially covered by the initial shading layer 3 is configured so that its aperture ratio among the RGB sub-pixels is exactly or close to 1:1.05:1.02. For example, a pixel 5 circled in FIG. 3 has its RGB sub-pixels all partially covered by the initial shading layer 3. Then, additional shading layer is provided to the GB sub-pixels having greater apertures so as to adjust the pixel 5's aperture ratio among its RGB sub-pixels. Specifically, the R sub-pixel is not provided additional shading layer but the GB sub-pixels are provided with additional shading layers. In other words, the R sub-pixel (i.e., sub-pixel of the smallest aperture) has its aperture unchanged, the GB sub-pixels (i.e., sub-pixels of greater apertures) has their apertures reduced. Adjusting the aperture ratio among the sub-pixels of the pixel 5 is equivalent to adjusting the brightness ratio among the sub-pixels of the pixel 5. The aperture ratio or brightness ratio is adjusted using those ratios of a pixel in a central location of the active area as reference.

The present invention also teaches a structure of an irregular shaped panel designed by the above described design method. As shown in FIG. 3, the structure includes an initial shading layer 3 along an edge of the panel's actual display area, normal pixels not covered by the initial shading layer 3, pixels entirely covered by the initial shading layer 3, and pixels partially covered by the initial shading layer 3. For pixels partially covered by the initial shading layer 3, there are first pixels and/or second pixels. The first sub-pixel, such as the pixel 4, has at least a sub-pixel entirely covered by the initial shading layer 3. The first pixels are set to be always turned off or are covered entirely by adding additional shading layer. The second pixels, such as the pixel 5, has all of their sub-pixels partially covered by the initial shading layer 3.

The structure of the irregular shaped panel designed by the above described design method has the brightness ratios among the sub-pixels of the second pixels adjusted to be identical or close to that among the sub-pixels of the normal pixels under a same driving condition. Therefore, the jagged feel along the edge of the area of notch or irregularity may be reduced or eliminated, the color shift along the edge of the area of notch or irregularity may be eliminated.

Figure 4A:
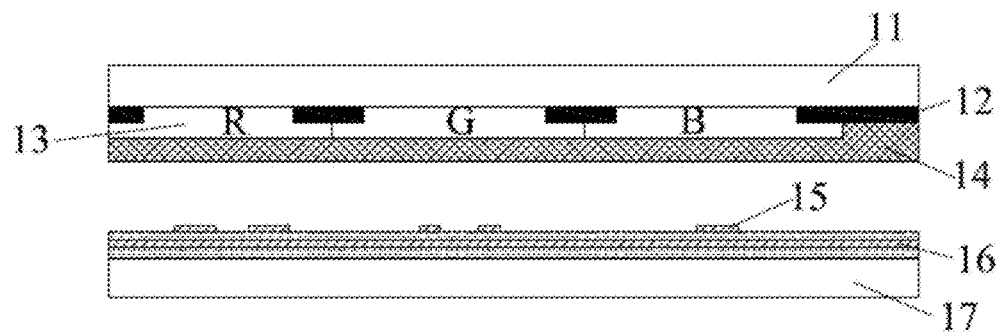
FIGS. 4A and 4B are schematic diagrams showing a structure of an irregular shaped panel according to a second embodiment of the present invention.
Figure 4B:
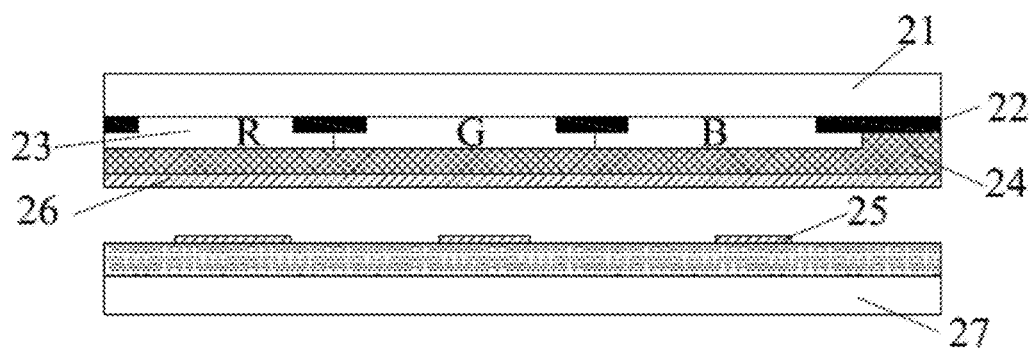

FIGS. 4A and 4B are schematic diagrams showing a structure of an irregular shaped panel according to a second embodiment of the present invention. The difference between the present embodiment and the first embodiment lies in that, for pixels whose RGB sub-pixels are all partially covered by the initial shading layer, their brightness ratios among sub-pixels are adjusted to be consistent with that among the sub-pixels of normal sub-pixels under a same voltage or at a same gray level, not by adding additional shading layers to adjust the aperture ratios, but by adjusting the shape/dimension/area of the pixel electrodes of the sub-pixels so that the color shift or non-uniform brightness caused by inconsistent aperture ratio along the edge of the area of notch or irregularity may be eliminated.

FIG. 4A uses a fringe field switching (FFS) display panel as an example. The irregular shaped panel includes on the color filter substrate side an upper substrate 11, a shading layer 12, RGB color resists 13, and a planarization layer 14 and, on the thin film transistor (TFT) array substrate side, pixel electrodes 15, common electrode 16, and a lower substrate 17. The RGB sub-pixels includes oppositely disposed RGB color resists 13 and pixel electrodes 15. Liquid crystal molecules are disposed between the TFT array substrate and the color filter substrate. For a pixel along an edge of an actual display area, assuming its RGB sub-pixels has decreasing coverage by the initial shading layer, their brightness ratio may be adjusted to be identical or close to that among the sub-pixels of a pixel in the active area center by changing the pixel electrodes 15's shape, dimension, or area so that liquid crystal molecules for the RGB sub-pixels have corresponding decreasing performance. For example, in FIG. 4A, the R sub-pixel has two greater slit electrodes 15, the G sub-pixel has two smaller slit electrodes 15, and the B sub-pixel has the smallest slit electrode 15.

FIG. 4B uses a vertical alignment (VA) or twisted nematic (TN) display panel as an example. The irregular shaped panel includes on the color filter substrate side an upper substrate 21, a shading layer 22, RGB color resists 23, a planarization layer 24, and common electrode 26 and, on the TFT array substrate side, pixel electrodes 25, and a lower substrate 27. The RGB sub-pixels includes oppositely disposed RGB color resists 23 and pixel electrodes 25. Liquid crystal molecules are disposed between the TFT array substrate and the color filter substrate. For a pixel along an edge of an actual display area, assuming its RGB sub-pixels has decreasing coverage by the initial shading layer, their brightness ratio may be adjusted to be identical or close to that among the sub-pixels of a pixel in the active area center by changing the pixel electrodes 25's shape, dimension, or area. For example, in FIG. 4B, the pixel electrodes 25 of the RGB sub-pixels have corresponding decreasing areas.

Based on the design method, the present invention is able to provide a second embodiment of the structure for improving the display quality of an irregular shaped panel as described above.

Figure 5A:
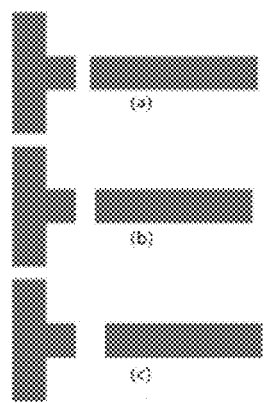
FIGS. 5A and 5B are schematic diagrams showing a structure of an irregular shaped panel according to a third embodiment of the present invention.
Figure 5B:
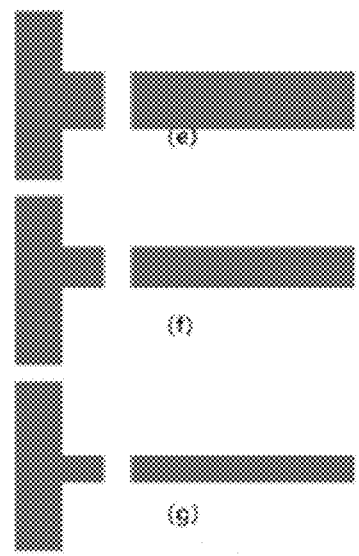

FIGS. 5A and 5B are schematic diagrams showing a structure of an irregular shaped panel according to a third embodiment of the present invention. The first and second embodiments rely on the TFTs charged by the pixel electrodes. The present embodiment relies on the ditch regions of the TFTs. The adjustment to the brightness ratio among sub-pixels is achieved through adjusting the width and/or length of the ditch regions of the TFTs. The ditch region width refers to the distance traversed by TFT charge carriers. A smaller ditch region width implies that charge carriers may pass through the ditch region more quickly, thereby achieving higher charging efficiency and greater brightness. The ditch region length refers to the cross-sectional area traversed by TFT charge carriers. A greater ditch region length achieves higher charging efficiency and greater brightness, whereas a smaller ditch region length provides lower charging efficiency and brightness.

Using the pixel 5 of FIG. 3 as an example, its RGB sub-pixels are all partially covered by the initial shading layer 3 where the coverage area of R sub-pixel>the coverage area of G sub-pixel>the coverage area of B sub-pixel. Then, according to the present embodiment, the ditch regions are designed so that the charging efficiency of R sub-pixel>the charging efficiency of G sub-pixel>the charging efficiency of B sub-pixel, thereby achieving a brightness ratio among the RGB sub-pixels comparable to that in the active area center so that the color shift or non-uniform brightness caused by inconsistent aperture ratio along the edge of the area of notch or irregularity may be eliminated. The (a), (b), and (c) of FIG. 5A show the respective ditch regions for a pixel's RGB sub-pixels. The (e), (f), and (g) of FIG. 5B show the respective ditch regions for a pixel's RGB sub-pixels. These ditch regions may have different widths or different lengths or both.

Based on the design method, the present invention is able to provide a third embodiment of the structure for improving the display quality of an irregular shaped panel as described above.

Figure 6:
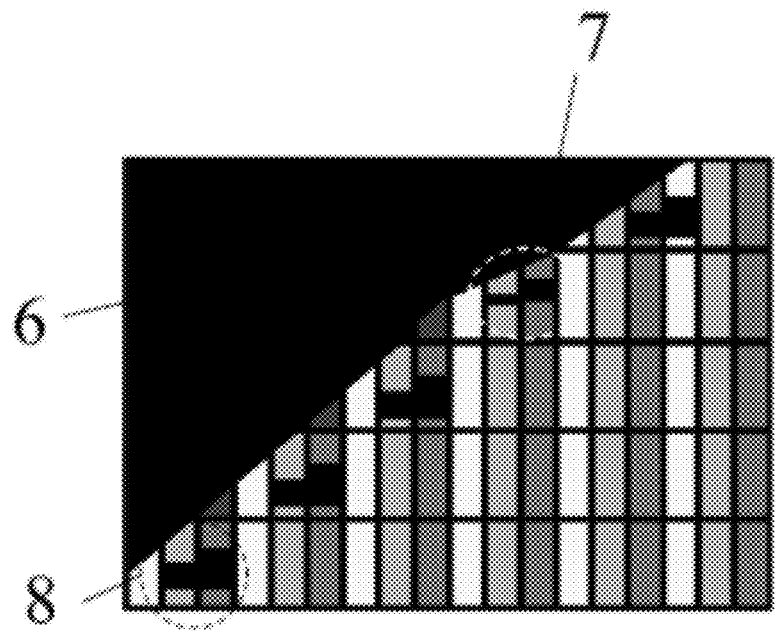
FIG. 6 is a schematic diagram showing a structure of an irregular shaped panel according to a fourth embodiment of the present invention.

FIG. 6 is a schematic diagram showing a structure of an irregular shaped panel according to a fourth embodiment of the present invention. In contrast to the first embodiment, the RGB sub-pixels along the edge of actual display area are not covered by the initial shading layer 6 always at constant coverage areas. For example, a pixel 7 and a pixel 8 circled in FIG. 6 are both partially covered by the initial shading layer 6. Comparing the pixels 7 and 8, their R sub-pixels have different coverage areas, and/or their G sub-pixels have different coverage areas, and/or their B sub-pixels have different coverage areas. Then, the various approaches using additional shading layers, or different pixel electrodes, or different ditch regions may be applied differently to the R sub-pixels, and/or the G sub-pixels, and/or the B sub-pixels of the pixels 7 and 8.

Based on the design method, the present invention is able to provide a fourth embodiment of the structure for improving the display quality of an irregular shaped panel as described above.

It should be noted that adjusting the pixels along the edge of the area of notch or irregularity is not limited to one specific design approach described above. Two or more design approaches may be jointly applied. Correspondingly, the pixels along the edge of the area of notch or irregularity is not limited to one specific structure described above. Two or more structures may be adopted simultaneously.

It should be noted that the above embodiments uses liquid crystal display (LCD) panels as examples. The present invention is however not limited as such. The present invention may also be applied to, for example, organic light emitting diode (OLOED) display panels. For example, for an OLED display panel, an approach similar to the first embodiment that uses different pixel definition layer areas or adding additional pixel definition layers to adjust aperture ratio, and therefore brightness ratio, among RGB sub-pixels. Another approach similar to the second embodiment uses different anode or cathode electrode areas to adjust brightness ratio among RGB sub-pixels. Yet another approach similar to the third embodiment uses different ditch regions in the driving TFTs to the RGB sub-pixels so as to adjust their brightness ratio. For persons skilled in the related art, the above embodiments are only exemplary. Using the design method taught by the present invention, various structures that may improve the display quality of an irregular shaped panel may be achieved.

As described above, the design method and the structure taught by the present invention is able to reduce or eliminate jagged feel along an edge of the area of notch or irregularity, and to eliminate color shift along an edge of the area of notch or irregularity, of an irregular shaped panel.

Above are embodiments of the present invention, which does not limit the scope of the present invention. Any equivalent amendments within the spirit and principles of the embodiment described above should be covered by the protected scope of the invention.

What is claimed is:

1. A design method for improving display quality of an irregular shaped panel, comprising
   Step 10: disposing an initial shading layer along an edge of the panel's actual display area;
   Step 20: for a pixel not entirely covered by the initial shading layer but having at least a sub-pixel entirely covered by the initial shading layer, setting the pixel to be turned off at all times, or extending the initial shading layer to cover the pixel; and
   Step 30: for a pixel and each of its sub-pixels not entirely covered by the initial shading layer, adjusting a brightness ratio among the pixel's sub-pixels so that, the brightness ratio is identical or close to that among sub-pixels of a normal pixel not covered by the initial shading layer under a same driving condition.

2. The design method according to claim 1, wherein Step 30's adjusting the brightness ratio is achieved through adjusting an aperture ratio among the pixel's sub-pixels.

3. The design method according to claim 2, wherein, for a liquid crystal display (LCD) panel, adjusting aperture ratio among the pixel's sub-pixels is achieved through adding additional shading layer to the pixel's sub-pixels; and,
   for an organic light emitting diode (OLED) display panel, adjusting aperture ratio among the pixel's sub-pixels is achieved through adjusting pixel definition layer areas or adding additional pixel definition layer to the pixel's sub-pixels.

4. The design method according to claim 1, wherein, for a LCD panel, Step 30's adjusting the brightness ratio is achieved through adjusting pixel electrode shapes, dimensions, or areas of the pixel's sub-pixels; and,
   for an OLED display panel, Step 30's adjusting the brightness ratio is achieved through adjusting anode or cathode electrode areas of the pixel's sub-pixels.

5. The design method according to claim 1, wherein, for a LCD panel, Step 30's adjusting the brightness ratio is achieved through adjusting widths or lengths of ditch regions of thin film transistors (TFTs) charging pixel electrodes of the pixel's sub-pixels; and,
   for an OLED display panel, Step 30's adjusting the brightness ratio is achieved through adjusting widths or lengths of ditch regions of TFTs driving the pixel's sub-pixels.

6. The design method according to claim 1, wherein, for a LCD panel, Step 30's adjusting the brightness ratio is achieved through at least one of
   adjusting an aperture ratio among the pixel's sub-pixels;
   adjusting pixel electrode shapes, dimensions, or areas of the pixel's sub-pixels; and
   adjusting widths or lengths of ditch regions of TFTs charging pixel electrodes of the pixel's sub-pixels.

7. The design method according to claim 1, wherein, for an OLED panel, Step 30's adjusting the brightness ratio is achieved through at least one of
   adjusting an aperture ratio among the pixel's sub-pixels;
   adjusting anode or cathode electrode areas of the pixel's sub-pixels;
   adjusting widths or lengths of ditch regions of TFTs driving the pixel's sub-pixels.

8. A structure for improving display quality of an irregular shaped panel, comprising an initial shading layer along an edge of the panel's actual display area, a plurality of normal pixels not covered by the initial shading layer, a plurality of pixels entirely covered by the initial shading layer, and a plurality of pixels partially covered by the initial shading layer, wherein the pixels partially covered by the initial shading layer comprises first pixels or second pixels; the first pixel has at least a sub-pixel entirely covered by the initial shading layer; the first pixels are set to be always turned off or are covered entirely by adding additional shading layer; the second pixels has all of their sub-pixels partially covered by the initial shading layer; the second pixels are adjusted to have a brightness ratio among their sub-pixels identical or close to that among sub-pixels of a normal pixel under a same driving condition.

9. The structure according to claim 8, wherein the second pixels are adjusted to have the brightness ratio through adjusting an aperture ratio among the second pixels' sub-pixels.

10. The structure according to claim 9, wherein, for a LCD panel, adjusting the aperture ratio is achieved through adding additional shading layers to the second pixels' sub-pixels; and,
    for an OLED display panel, adjusting the aperture ratio is achieved through adjusting pixel definition layer areas or adding additional pixel definition layers to the second pixels' sub-pixels.

11. The structure according to claim 8, wherein, for a LCD panel, the second pixels are adjusted to have the brightness ratio through adjusting pixel electrode shapes, dimensions, or areas of the second pixels' sub-pixels; and, for an OLED display panel, the second pixels are adjusted to have the brightness ratio through adjusting anode or cathode electrode areas of the second pixels' sub-pixels.

12. The structure according to claim 8, wherein, for a LCD panel, the second pixels are adjusted to have the brightness ratio through adjusting widths or lengths of ditch regions of TFTs charging pixel electrodes of the pixels' sub-pixels; and, for an OLED display panel, the second pixels are adjusted to have the brightness ratio through adjusting widths or lengths of ditch regions of TFTs driving the second pixels' sub-pixels.

13. The structure according to claim 8, wherein, for a LCD panel, the second pixels are adjusted to have the brightness ratio through at least one of adjusting an aperture ratio among the second pixels' sub-pixels;

adjusting pixel electrode shapes, dimensions, or areas of the second pixels' sub-pixels; and adjusting widths or lengths of ditch regions of TFTs charging pixel electrodes of the second pixels' sub-pixels.

14. The structure according to claim 8, wherein, for an OLED display panel, the second pixels are adjusted to have the brightness ratio through at least one of adjusting an aperture ratio among the second pixels' sub-pixels;

adjusting anode or cathode electrode areas of the second pixels' sub-pixels; and adjusting widths or lengths of ditch regions of TFTs driving the second pixels' sub-pixels.

\* \* \* \* \*